United States Patent [19]

Shimizu et al.

[11] Patent Number: 4,999,656
[45] Date of Patent: Mar. 12, 1991

[54] INTERCHANGEABLE LENS WITH DOUBLE-SIDED PRINTED CIRCUIT BOARD

[75] Inventors: Masami Shimizu, Tokyo; Shigeo Nakashima; Yutaka Fujiwara, both of Kawasaki; Masaharu Eguchi, Yokohama, all of Japan

[73] Assignee: Canon Kabushiki Kaisha, Tokyo, Japan

[21] Appl. No.: 356,236

[22] Filed: May 24, 1989

[30] Foreign Application Priority Data

May 24, 1988 [JP] Japan ................................. 63-126371
May 24, 1988 [JP] Japan ................................. 63-126372

[51] Int. Cl.$^5$ ............................................. G03B 1/18
[52] U.S. Cl. ................................. 354/195.12; 354/286
[58] Field of Search ........................... 354/195.1–201, 354/485, 286

[56] References Cited

U.S. PATENT DOCUMENTS

| | | | |
|---|---|---|---|
| 4,596,454 | 6/1986 | Kawai et al. | 354/286 |
| 4,721,972 | 1/1988 | Wakabayashi | 354/195.1 |
| 4,804,331 | 2/1989 | Eguchi et al. | 439/162 |
| 4,844,586 | 7/1989 | Suzuki et al. | 354/195.1 |
| 4,864,348 | 9/1989 | Fujiwara et al. | 354/485 |

Primary Examiner—Brian W. Brown
Attorney, Agent, or Firm—Fitzpatrick, Cella, Harper & Scinto

[57] ABSTRACT

A lens barrel incorporating electric parts such as motors. The lens barrel has a double-sided printed circuit board disposed such that its major plane extend substantially orthogonally to the optical axis. Chip elements such as circuit elements are mounted on the front side of the double-sided printed circuit board while flexible connecting members for connection to the electrical parts are provided on the rear side of the double-sided printed circuit board. A land for allowing electrical check of electric circuit is also provided on the rear side of the double-sided printed circuit board.

24 Claims, 7 Drawing Sheets

INTERCHANGEABLE LENS WITH DOUBLE-SIDED PRINTED CIRCUIT BOARD

BACKGROUND OF THE INVENTION

1. Field of the Invention:

The present invention relates to a lens barrel having a double-sided printed circuit board loaded with electrical circuits.

2. Description of the Related Art

In recent years, automatic single-lens reflex cameras having a variety of functions such as auto-focus function are becoming popular. Interchangeable lenses to be used on such cameras also are required to incorporate electrical parts such as a focus detection motor, an electromagnetic aperture device and so forth. In consequence, electrical circuits mounted in such lenses are becoming large in scale and complicated in construction.

On the other hand, there is a trend for smaller sizes of camera bodies and interchangeable lenses, as well as requirement for packaging various complicated mechanisms in compact camera bodies and lenses. In consequence, only small spaces are available for the electrical circuits to be incorporated in camera bodies and interchangeable lenses.

In cameras and interchangeable lenses of the type described, therefore, electrical circuits are loaded in the form of printed circuit board having a flexible substrate to form an electrical circuit unit which is mounted in a small space, or gap, formed between an outer shell wall of the camera body and internal mechanisms.

For instance, a method of loading electrical circuit in a lens barrel has been proposed by the same applicant. This method will be described with specific reference to FIGS. 8 to 10.

Referring to FIG. 8, a first flexible printed circuit board 101 and a second flexible printed circuit board 102 are shown in a state before mounting in a cylindrical housing 110 such as a lens barrel.

The first flexible printed circuit board 101 has a first main domain 101a and first connection domain 101b which is connected to a FIRST lead portion 101d leading from the first main domain 101a. The first main domain 101a is connected to an actuator (not shown) such as, for example, an aperture driving motor and a focusing motor, and is disposed in the axial direction of the barrel within the casing, i.e., in parallel with the optical axis.

The first connection domain 101b has a first connection pattern portion 101e for electrical connection to another printed circuit board and also has first locating holes 101c, and projects outside the housing 110.

On the other hand, the second flexible printed circuit board 102 has a second main domain 102a and a second connection domain 102b connected to a second lead portion 102d leading from the second main domain 102a. The second main domain 102a has a doughnut-like form and may carry electrical parts such as ICs, resistors, capacitors and so forth collectively denoted by 102f. The second main domain 102a is held on a step surface 110a which is orthogonal to the axis of the housing 110. The second connection domain 102b is provided with a second connection pattern 102e for electrical connection to the first flexible printed circuit board 101 and also has second locating holes 102c.

The second main domain 102a is mounted in the housing 110 so as to orthogonally cross the axis of the housing 110. In this state, the second connection domain 102b initially projects axially and outwardly of the housing 110 as shown in FIG. 9, so as to contact with the first connection domain 101b of the first flexible printed circuit board 101 at a position outside the housing 110. In this state, the first connection domain 101b and the second connection domain 102b are located by means of the locating holes 101c, 102c with the aid of a suitable jig which is not shown. Thereafter, the connection patterns 101e and 102e of both connection domains 101b and 102b are electrically connected by, for example, soldering as at 103. After the completion of the connection, the connection domains 101b and 12b outside the housing are bent inwardly of the housing so as to overlie the second main domain 102a as shown in FIG. 10.

Then, a lens mount 104 and a decorative sleeve 105 are mounted to complete the lens barrel.

This known arrangement, however, has the following disadvantages. Namely, the flexible printed circuit board 102 essentially has projected portions, 102b to 102e inclusive, because of the necessity for the mounting of the electrical parts 102f on the doughnut-shaped second major domain 102a. In consequence, the flexible circuit board in its developed state has a considerable size, resulting in a relatively high production cost.

The same applicant has proposed various related structures which pertain to mounting of a printed circuit board in a lens barrel and filed patent applications on such arts: namely, U.S. patent application Ser. No. 134,976 (filed Dec. 18, 1987); U.S. Pat. No. 4,596,454; U.S. patent application Ser. No. 239,263 (filed Sept. 1, 1988); U.S. patent application Ser. No. 274,959 (filed Nov. 22, 1988); U.S. Pat. No. 4,804,331; and U.S. patent application Ser. No. 136,346 (filed Dec. 22, 1987).

SUMMARY OF THE INVENTION

According to one aspect of the present invention, there is provided a lens barrel comprising: a main double-sided main printed circuit board incorporated in the body of the lens barrel such as to orthogonally cross the optical axis of the lens barrel, with one side of the double-sided main printed circuit board facing forwardly of the camera as viewed in the direction of the optical axis carrying integrated circuit elements such as ICs, while the opposite side faces rearwardly of the camera and carries a flexible printed circuit board, so that the rearwardly facing side of the double-sided main printed circuit board has at least one land for checking an electrical circuit.

This improved lens barrel facilitates assembly and electrical check of the electrical part of the lens barrel.

DESCRIPTION OF THE PREFERRED EMBODIMENT

The invention will be more fully understood from the following description of a preferred embodiment.

Figure 1:
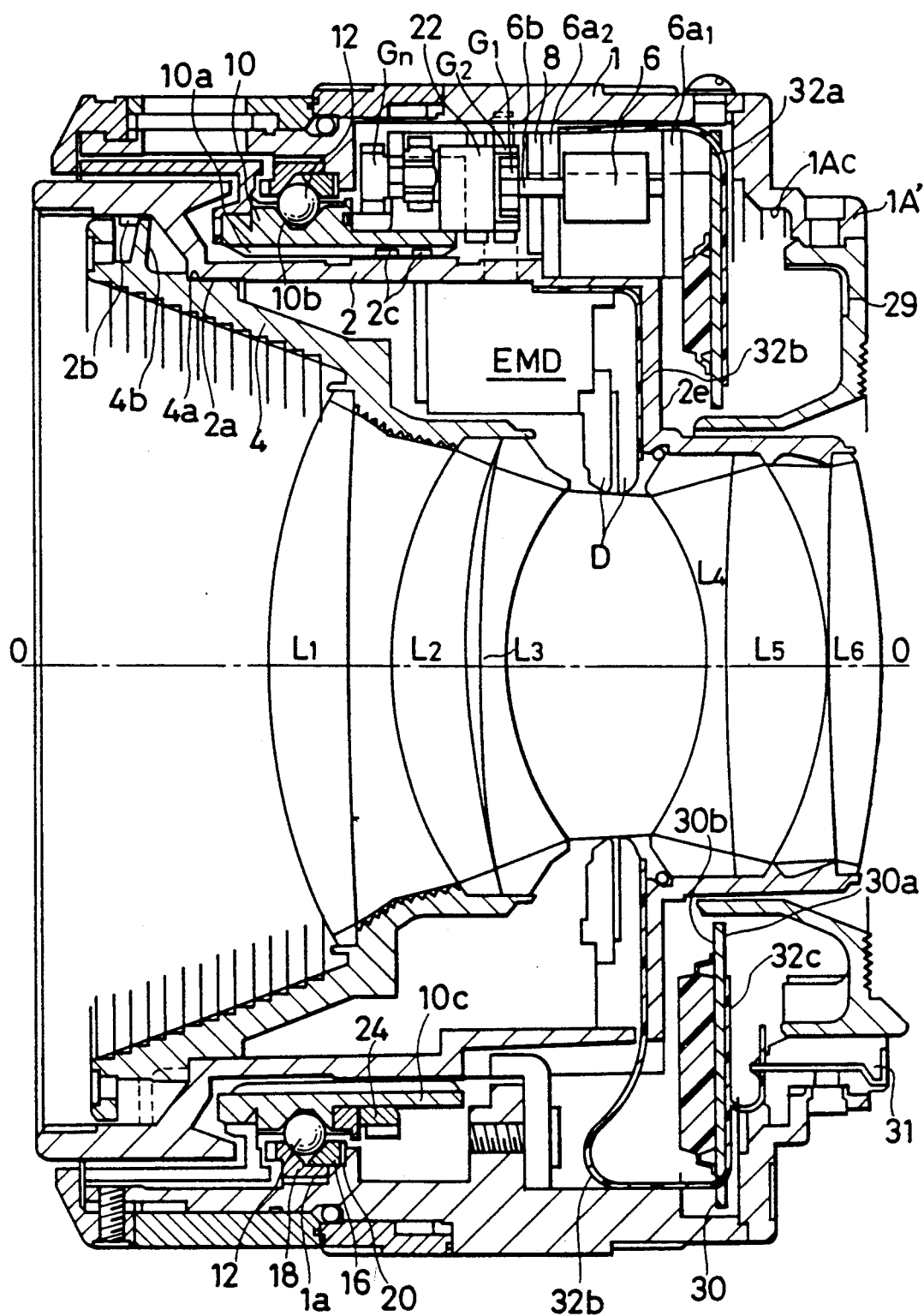
FIG. 1 is a sectional view of an embodiment of a lens barrel in accordance with the present invention.

FIG. 1 is a sectional view of a lens barrel embodying the present invention.

The lens barrel has a stationary sleeve 1 which is provided at its one end with a bayonet mount 1A for a conventional coupling to a camera body (not shown).

The manner of a back-focus adjustment first will be described hereinafter with reference to FIGS. 2 to 5.

Figure 2:
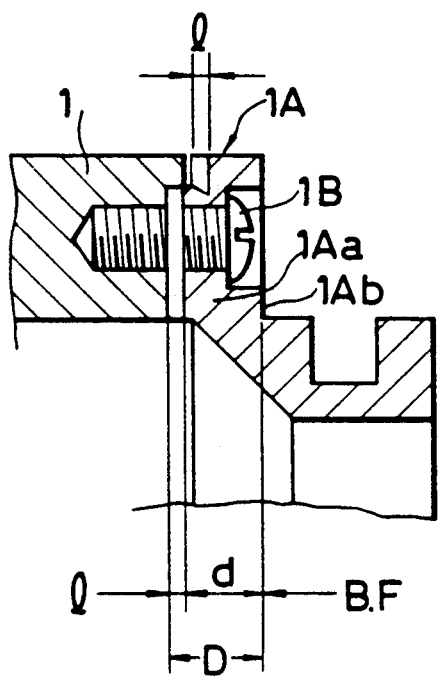
FIGS. 2 and 3 are partial sectional views of a portion of the lens barrel, in order to illustrate a back-focus adjusting operation.
Figure 4:
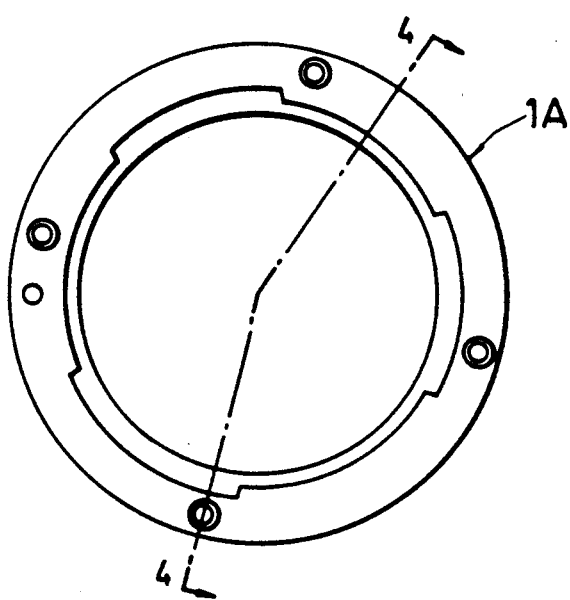
FIG. 4 is a front plan view illustrative of the back-focus adjusting operation.
Figure 5:
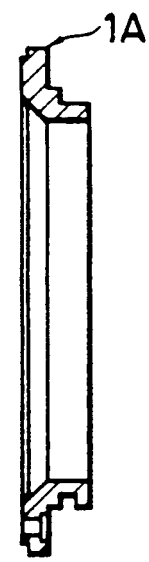
FIG. 5 is a sectional side view taken along the line IV—IV of FIG. 4.

Referring to FIG. 2, a dummy bayonet mount 1A on the stationary sleeve 1 has a coupling flange 1Aa the thickness D of which is configured so as to be greater than the final thickness d required for allowing a back-focus adjustment, that will be explained hereinafter. The rear surface of the coupling flange 1Aa is provided with a reference surface 1Ab that is used for measuring and adjusting the back-focus amount. Through-holes for receiving screws 1B are formed in the coupling flange 1Aa so as to open through the reference surface 1Ab. The dummy bayonet mount 1A has a front plan view shape and a sectional side view shape as shown in FIGS. 4 and 5, respectively. Thus, the bayonet mount 1A element itself has a construction which is substantially the same as those of known bayonet mounts.

The stationary sleeve 1 to which the dummy bayonet mount 1A is coupled has screw holes provided in its rear end surface thereof that are registered with the above-mentioned through-holes formed in the bayonet mount 1A. Thus, the bayonet mount 1A and the stationary sleeve 1 are coupled to each other by screws 1B that are screwed into the threaded holes of the sleeve 1 through the through-holes formed in the flange 1Aa of the mount 1A.

The stationary sleeve 1 used in this embodiment is of the type having a focusing ring and a helicoid sleeve integrated with each other.

The initial adjustment of back-focus of the lens barrel is conducted in the following manner.

Figure 3:
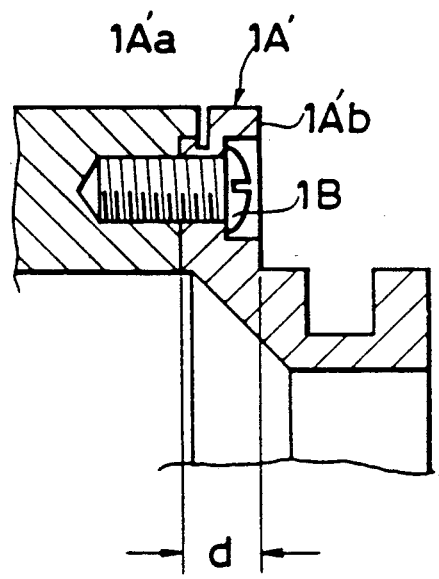

A dummy mount 1A having a thickness equal to the reference thickness D is temporarily fixed to the stationary sleeve 1 by means of screws 1B in a manner shown in FIG. 2. Then, the stationary sleeve 1 is fixed to a collimator for measurement of the back-focus amount BF (not shown). As stated before, the the thickness D of the coupling flange 1Aa of the dummy mount 1A is determined to be greater than the thickness d corresponding to the back-focus obtained through the measurement. It is to be understood that the thickness d varies according to the measured value of the back focus. It is therefore understood that a mount which can suitably be used has a thickness which is obtained by subtracting, from the thickness D of the flange 1Aa, the excess value e of the flange thickness. Thus, the optimum mount which can optimumly be used has a flange thickness given by d=D−e. After demounting the dummy mount 1A from the stationary sleeve 1, the joint surface of the coupling flange 1A'a of another piece of mount 1A' of the same type is machined to reduce the flange thickness to d, as shown in FIG. 3. The machining is effected by a lathe or a milling cutter, using the reference surface 1A'b as a reference.

The mount 1A', the thickness of the flange 1A'a thereof has been reduced to d by machining, is coupled to the stationary sleeve 1, whereby a lens barrel assembly having adjusted back focus amount is obtained.

Referring to FIG. 1, first and second movable rings 2 and 4 hold the respective groups of focusing lenses $L_4$ to $L_6$ and $L_1$ to $L_3$. The outer peripheral surface of the second movable ring 4 has a fitting portion 4a which is sized to fit on the inner peripheral surface 2a of the first movable ring 2 and also a fixing means for fixing the second movable ring 4 on the first movable ring 2. The fixing means include a plurality of second ring projections 4b projecting outward from the outer peripheral surface of the second movable ring 4 and capable of engaging with first ring engaging portions 2b provided on the inner surface of the first movable ring 2.

A motor 6 held on the stationary sleeve 1 comprises yokes $6a_1$ and $6a_2$ fixed to the stationary sleeve 1, a stator made of a permanent magnet (not shown), and a rotor having a coil and a rotor shaft 6b. A train of gears $G_1$ to $G_n$ is arranged to transmit the output rotation of the rotor shaft 6b while reducing the rotation speed. The gears are rotatably supported by a base plate 8 fixed to the stationary sleeve 1.

A rotary ring 10 is rotatable with respect to a fixed portion of the stationary sleeve 1. The rotary ring 10 is provide on the inner peripheral surface thereof with an inner helicoid portion 10a that engages with an outer helicoid portion 2c formed on the outer peripheral surface of the first movable ring 2. The rotary ring 10 also has provided, on the outer peripheral surface thereof, a ball race groove 10b having a V-shaped section and capable of receiving bearing balls 12.

The bearing balls 12 received in the ball race groove 10b in the rotary ring 10 are held in the form of a train. A conventional ball spacer (not shown) may be used for the purpose of preserving spaces between adjacent balls 12. The bearing balls 12 are held against the ball race groove by a first ball retaining ring 16 and a second ball retaining 18. The first ball retaining ring 16 fits in the stationary sleeve 1 and is provided on one end thereof with a tapered surface. The second ball retaining ring 18 is screw connected to an internal screw thread 1a of the stationary sleeve 1.

The level of pre-load applied to the bearing balls 12 is adjustable by varying the thickness of a tabular spacer 20 which is disposed between the first ball retaining ring 16 and the stationary sleeve 1. The lens position may be detected by a conventional lens position detector such as an encoder (not shown) that is disposed within the aforementioned gear mechanism.

The rotary ring 10 has a portion 10c of a reduced outside diameter, to which is fixed a gear ring 24. The gear 24 meshes with an output gear of the gear train $G_1$-$G_n$.

The arrangement is such that a space which can accommodate the motor 6 and the gears $G_1$-$G_n$ is defined between the movable ring 2 and the stationary sleeve 1. This space is preserved by bearing assembly defined by elements 10, 16 and 18 for the balls 12, that are fixed between the stationary sleeve 1 and the movable ring 2.

An aperture unit D is fixed to the inner peripheral surface of the movable ring 2 and a reduced-diameter wall portion 2e of the movable ring 2 is driven by a motor, EMD. The motor EMD is fixed to the inner peripheral surface of the movable ring 2.

A reference numeral 30 denotes a rigid double-sided printed circuit board loaded with circuit for driving the motors 6 and EMD. This circuit board 30 is disposed between a reduced-diameter wall portion 2e at the rear surface of movable ring 2 and a front surface of the mount 1A' that faces forwardly of the camera as viewed in the direction of the optical axis. The circuit board 30 is fixed to the stationary sleeve 1 such that its major plane extends orthogonally to the optical axis 0—0. A reference numeral 31 designates a contact block for performing exchange of electrical signals, with the camera body (not shown).

The rigid double-sided printed circuit board 30 is connected to the motor 6, motor EMD and the contact block 31 through flexible printed circuit boards 32a, 32b and 32c, respectively. The double-sided printed circuit board 30 has a central opening for allowing light to pass therethrough, thus presenting a doughnut-like form.

The first flexible printed circuit board 32a and the second flexible printed circuit board 32b, are electrically connected at one end of each to the motor 6 and the motor EMD, respectively, and each then extends along the inner peripheral surface of the aperture unit D so as to lead to the exterior of the movable ring 2. The other ends of these first and second flexible printed circuit boards are then extended to the rear surface 30a of the hard double-sided printed circuit board 30, which faces rearwardly of the camera as viewed in the direction of the optical axis, and are then electrically connected to the surface 30a with a suitable degree of slack. It will be understood that any change in the size of the gap between the movable ring 2 and the stationary sleeve 1 that is caused by movement of the movable ring in the direction of optical axis is conveniently absorbed by the slack of the first and second flexible printed circuit boards 32a and 32b.

The third flexible printed circuit board 32c provides an electrical connection between the double-sided printed circuit board 30 and the contact block 3, while absorbing any change in the size of the gap therebetween caused by the back focus adjustment explained before.

Electric circuit element chips such as ICs are provided on the front surface 30b of the rigid double-sided printed board 30 which is directed forwardly of the camera as viewed in the direction of the optical axis, so as to face the reduced-diameter rear wall surface 2e of the movable ring 2.

According to this arrangement, only a few projections are formed on the surface 30a of the hard double-sided printed circuit board 30. Hence, a large space is preserved between the printed circuit board 30 and the reduced-diameter rear wall portion 2e of the movable ring 2, simply by providing a free space or gap which may be small enough to just permit the adjustment of the back focus amount. In consequence, electric circuit elements of considerably large sizes can be installed in this space.

The reduced-diameter rear wall portion 2e of the movable ring 2 could impair the mechanical strength of the movable ring 2, due to that reduced wall thickness. This problem, however, can be overcome by forming the movable ring 2 by molding such that the wall thickness may be locally increased at portions where no electric circuit part exists.

A reference numeral 29 denotes a decorative back sleeve lens fitting in the mount 1A'.

Figure 6A:
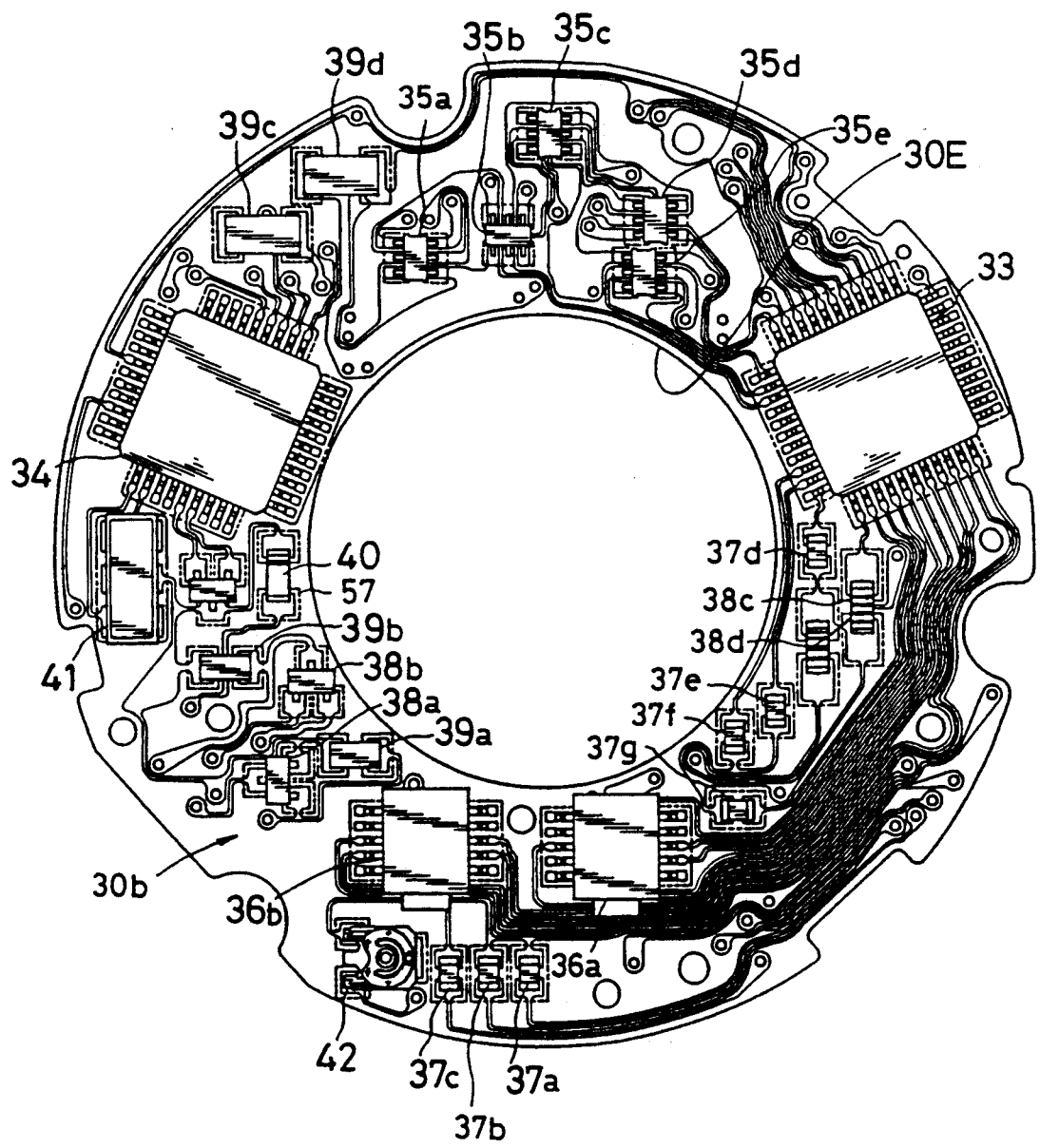
FIG. 6(a) is a plan view of a first or front side of a rigid double-sided printed circuit board.
Figure 6B:
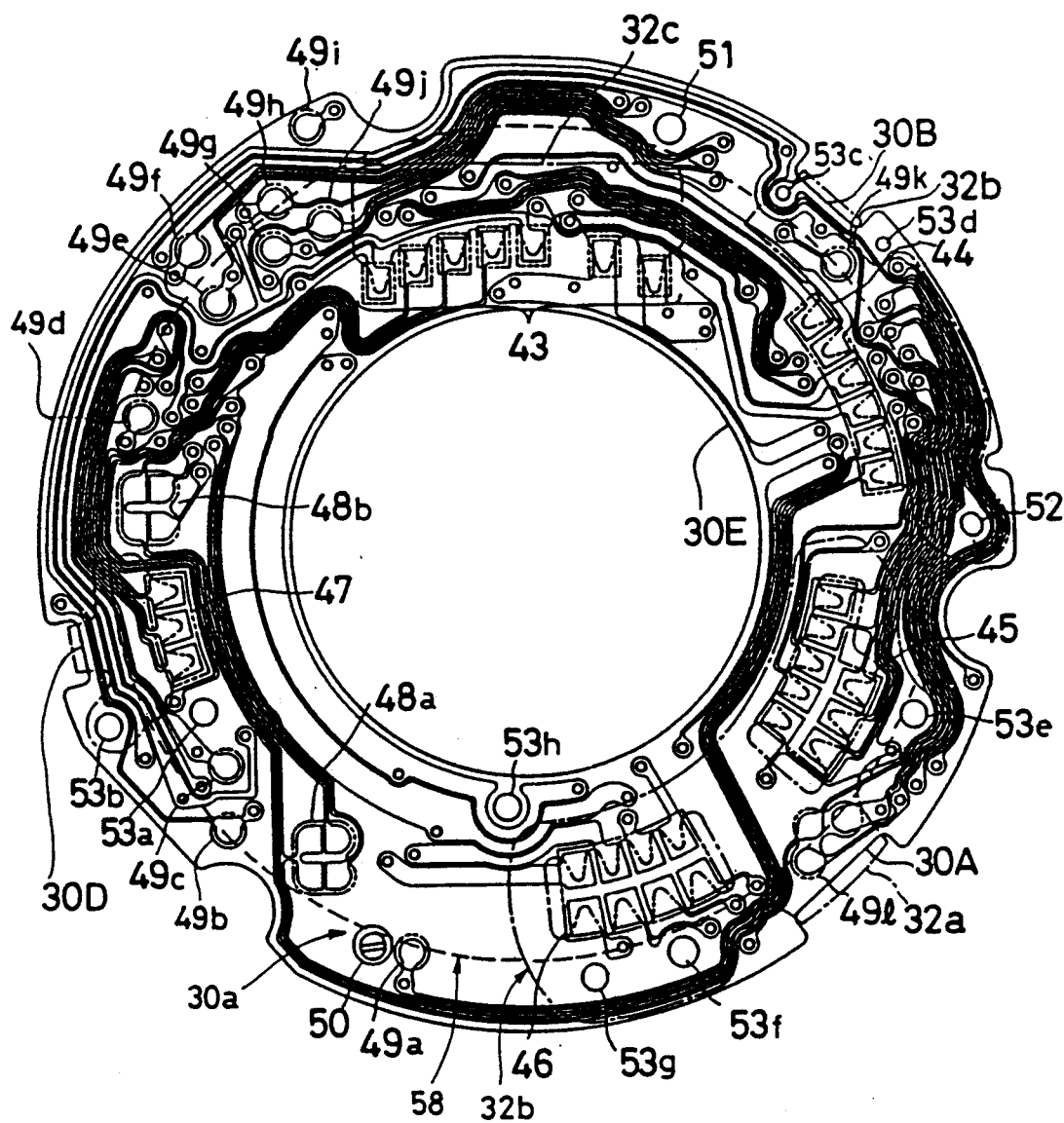
FIG. 6(b) is a plan view of a second or rear side of a rigid double-sided printed circuit board, that is transparently viewed from the obverse side of the plan view of FIG. 6(a)

FIGS. 6(a) and 6(b) are respectively front and rear plan views of circuit patterns on the element mounting surfaces of the rigid double-sided printed circuit board 30 shown in FIG. 1. FIG. 6 shows the front surface 30b which faces forwardly of the camera. FIG. 6(b) shows the rear surface 30a which faces rearwardly of the camera as viewed in the direction of the optical axis, with respect to FIG. 4. In the FIGS. 6(a) and 6(b), thick lines represent outer configurations, while thin lines show copper foil patterns. Two-dot-and-dash lines show openings of solder resist. Thus, the portions of the copper foil pattern other than the portions in the two-dot-and-dash line rectangles are covered by the solder resist. Small holes shown by thick lines within the areas of the copper foil pattern are through-hole plating holes which provide electrical connections between the circuit patterns on the front surface 30b and rear surface 30a of the hard double-sided printed circuit board 30. It is to be noted that FIG. 6(a) also shows the pattern on the rear surface 30a in a transparent view as viewed from the same side of the printed circuit board as the front surface 30b shown in FIG. 6(b), for an easier understanding of the overall circuit pattern.

Referring to FIG. 6(a), the front surface 30b of the rigid double-sided printed circuit board 30 carries large-sized IC chips 33,34 providing a lens control circuit, a transistor array 35a–35c, inclusive for driving the motor EMD, a transistor array 36a, 36b for driving the motor 6, a plurality of externally connected chip resistors 37a–37e inclusive, a plurality of externally connected resistors 38a to 38d, inclusive, a plurality of tantalum capacitors 39a to 39d, inclusive, a diode 40, a ceramics oscillator 41, and a semi-fixed volume 42. These electrical circuit elements are SMT (Surface Mounting Type) and are electrically connected to exposed conductor portions of the patterns on the surface 30b by known, re-flow soldering technique.

Referring now to FIG. 6(b), a numerals 43 and 44 denote exposed portions of the pattern for allowing the flexible printed circuit boards 32c and 32b to be connected thereto. Exposed portions 45 and 46 of the pattern are intended for connection of the flexible printed circuit board 32b. A reference numeral 47 designates an exposed portion of the pattern which is intended for connection of a flexible printed circuit board carrying a switch (not shown). Reference numerals 48a, 48b show other exposed connection points. One-dot-and-dash lines in FIG. 6(b) show the outer configuration of the flexible printed circuit boards. These flexible printed circuit boards are led to the printed circuit rear surface 30a via notched portions 30A,30B and 30D of the rigid double-sided printed circuit board 30. Numeral 57 denotes an exposed portion of the pattern on the front surface. After the mounting of the hard double-sided printed circuit board 30 in the lens barrel, electrical adjustment of the lens is executed by selectively allowing a short-circuit of this exposed portion 57 of the pattern. Other exposed portions 49a to 49l, inclusive, of the rear surface pattern are adapted to be contacted by a probe pin during checking and adjustment of the electrical circuits. Numeral 50 denotes a hole in the rear surface formed under the semi-fixed volume 42 on the front surface so as to allow the volume 42 to be adjusted from the rear surface 30a of the rigid double-sided printed circuit board 30 after a mounting of the board 30 in the lens barrel.

The rigid double-sided printed circuit board 30 mounted in the lens barrel is fixed to the movable 2 by means of screws that are driven through holes 51.

Number 52 denotes a locating hole for locating the rigid double-sided printed circuit board with respect to the lens. The locating hole 52 receives a locating pin (not shown) provided on the movable ring 2.

Locating holes for locating the flexible printed circuit boards with respect to the corresponding exposed portions 43 to 48 of the pattern for allowing soldering therebetween, as well as jig locating holes for locating jigs used in conducting re-flow soldering of the electrical circuit elements are provided on the front surface 30b of the rigid double-sided printed circuit board 30.

Figure 7A:
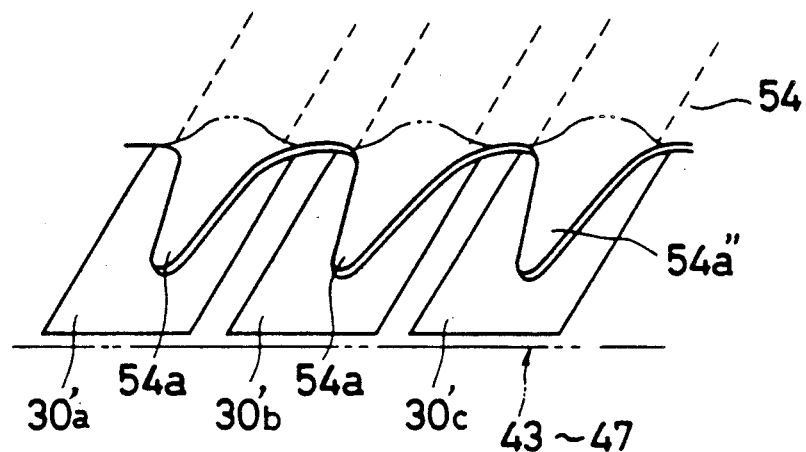
FIGS. 7(a), 7(b) and 7(c) are respectively two perspective views and a section view of the connection between the flexible printed circuit board and a rigid double-sided printed board.
Figure 7B:
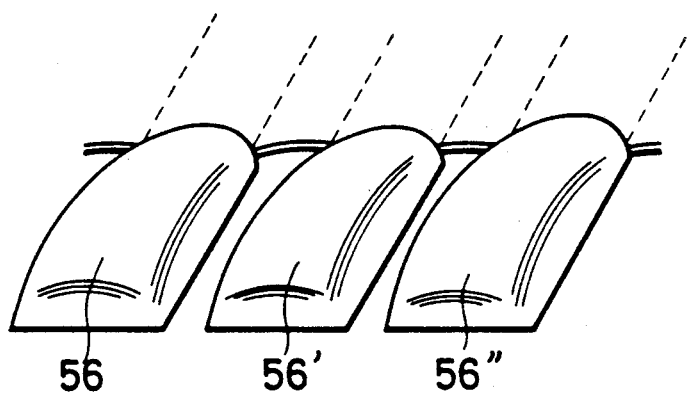
Figure 7C:
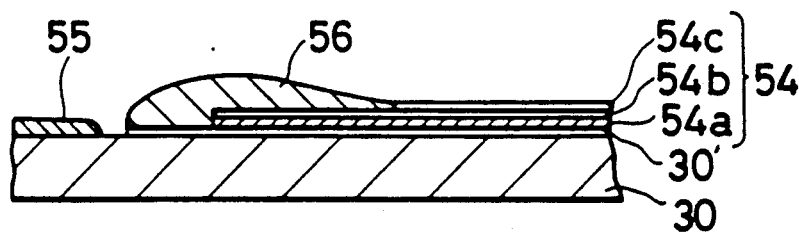
Figure 8:
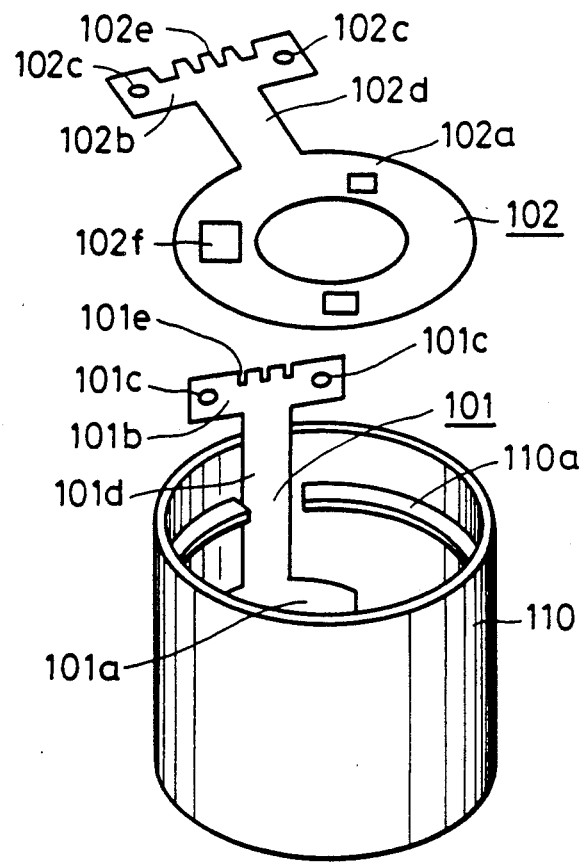
FIGS. 8 to 10 are illustrations of a prior art lens barrel structure.
Figure 9:
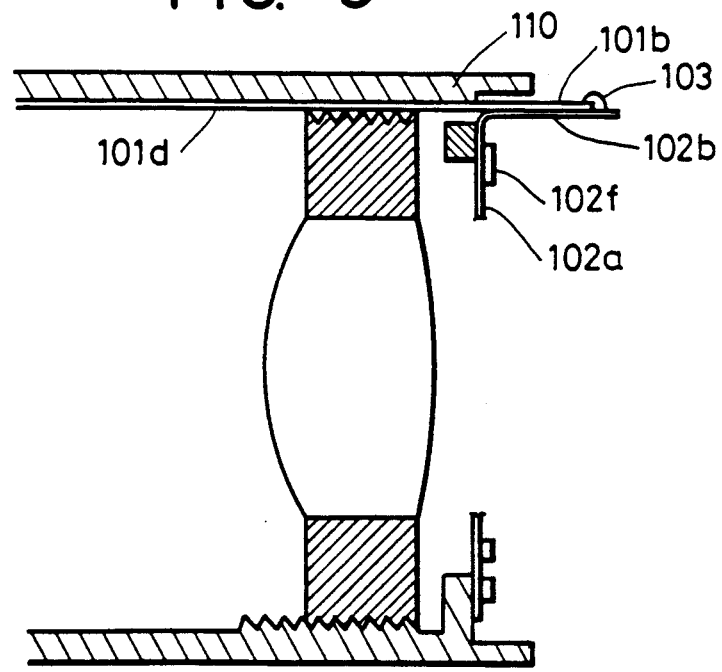
Figure 10:
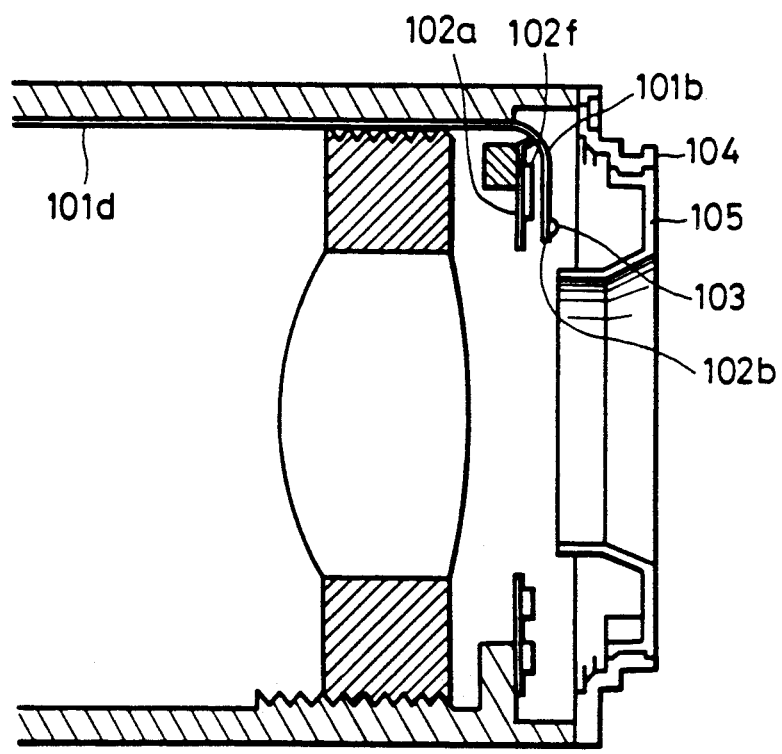

FIGS. 7(a), 7(b) and 7(c) show the manner in which the connecting flexible printed circuit boards 32a, 32b, 32c, and other flexible printed circuit boards, are to be connected to the corresponding exposed portions 43, 44, 45, 46 and 47 of the pattern on the rigid double-sided printed circuit board 30. Referring to FIG. 7(a), the rigid double-sided printed circuit board 30 in a state before the connecting portion of the flexible circuit board 54 is superposed and soldered thereto with the aid of the locating holes 53a to 53h, inclusive. Although the flexible printed circuit board 54 is specifically mentioned, it is to be noted that the flexible printed circuit boards 32a, 32b and 32 c are connected in the same manner. FIG. 7(b) shows the state of the rigid double-sided printed circuit board after completion of the connection by soldering. FIG. 7(c) shows in section the rigid double-sided printed circuit board in the state after the soldering. In these Figures, numeral 30'a to 30'c, inclusive, denote a copper foil pattern of the rigid double-sided printed circuit board 30; 54a, 54a' and 54a" denotes a base film of the flexible printed circuit board 54; 54b denotes a copper foil pattern of the flexible printed circuit board 54; and 54c denotes an insulating cover film f of the flexible printed circuit board 54.

Numeral 55 denotes a solder resist on the rigid double-sided printed circuit board 30, while 56, 56' and 56" denote soldering locations for an electrical connection. The solder 56, 56' and 56" are deposited on the copper pattern so as to cover a portion of the base film 54a of the flexible printed circuit board 54, thus attaining electrical connection therebetween.

Referring back to FIG. 6(b), a large broken-line circle 58 represents the outer configuration of the end surface 1Ac of the mount 1A' shown in FIG. 1. The gap between the mount 1A' and the rigid double-sided printed circuit board 30 is small in the region outside this circle so that a series of check lands 49a to 49l, inclusive, alone are disposed in this gap as illustrated. The gap between the mount 1A' and the rigid double-sided printed circuit board 30, however, is large in the region inside the above-mentioned circle, so that at least one connection land for connection to a flexible printed circuit board, which is used for electrical connection to interfaces, is disposed in the portion of the gap within the above-mentioned circle.

As will be understood from the foregoing description, in the lens barrel embodying the present invention, a double-sided printed circuit board is used with its both sides carrying electrical circuit patterns. The front side of this double-sided printed circuit board carrying integrated circuit chip elements is devoid of any electrical circuit elements of large area such as check lands and connection lands for connection to flexible printed circuit boards, so that the chip elements can be arranged with a high density. The rear side of the double-sided printed circuit board carries patterns and lands which are large in area but small in thickness, e.g., a series of check lands and connection lands for connection to flexible printed circuit boards. It is, therefore, possible to mount the double-sided printed circuit board in the vicinity of the lens mount 1A' so that a large space is available at the front side of the double-sided printed circuit board, remote from the lens mount, to enable many circuit parts to be installed. In addition, it becomes possible to install needed wiring for connection to various interfaces in a simple and neat form.

In the embodiment described hereinbefore, the electrical connections between the circuits on the double-sided printed circuit board and the flexible printed circuit boards are formed in central regions of the double-sided printed circuit board near the optical axis, while lands, such as a series of check lands are disposed in peripheral regions of the double-sided printed circuit board. This arrangement makes the check lands and other lands accessible simply by detaching the lens mount, thus facilitating checking of electrical circuits for the purpose of repair in case of any failure in the electronic circuit elements or printed circuits in the lens mount.

Although the invention as been described through its preferred forms, it is to be understood that the described embodiments are only illustrative and various changes and modifications may be imparted thereto. For instance, effects equivalent to those described can be obtained when an encoder capable of detecting the amount of movement of the lens or the position to which the lens has been moved, in place of the motor 6 used in the described embodiment.

What is claimed is:

1. An interchangeable lens comprising:
    double-sided printed circuit board with a front side and a rear side that is disposed such that its major plane extends substantially orthogonally to an optical axis of optical elements disposed axially along a lens barrel;
    electrical elements;
    at least one flexible connecting member for electrically connecting said electrical elements into electrical circuits on said double-sided printed circuit board;
    integrated circuit chip elements mounted on the front side of said double-sided printed circuit board which is directed forwardly of said lens barrel as viewed in the direction of said optical axis;
    lands provided on the rear side of said double-sided printed circuit board which is directed rearwardly of said lens barrel as viewed in the direction of said optical axis, said lands including lands for connection to said flexible connecting members and at least one check land for allowing electrical check of an electrical circuit; and
    a mount member provided on a rear end of said interchangeable lens as viewed in the direction of the optical axis, said mount member being capable of demountably mounting said interchangeable lens to a camera body.

2. An interchangeable lens according to claim 1, wherein said double-sided printed circuit board has a substantially doughnut-like form with a central opening about said optical axis serving as an area which permits a light beam to pass therethrough.

3. An interchangeable lens according to claim 1, wherein said double-sided printed circuit board has a centrally disposed open region about said optical axis which permits a light beam to pass therethrough.

4. An interchangeable lens according to claim 2, wherein said double-sided printed circuit board has at least one notch formed in an outer periphery thereof at a position corresponding to a position where at least one flexible connecting members is connected to a corresponding circuit on said double-sided printed circuit board.

5. An interchangeable lens according to claim 1, wherein said flexible connecting member comprises a flexible printed circuit boards.

6. An interchangeable lens according to claim 1, wherein said at least one flexible connecting member is connected to said double-sided printed circuit board in a slacked condition, so that said double-sided printed circuit board and at least one of said electrical elements permit a relative motion therebetween in the direction of the optical axis after the connection of said at least one connecting member to said double-sided printed circuit board.

7. An interchangeable lens according to claim 3, wherein said double-sided printed circuit board comprises a rigid material.

8. An interchangeable lens according to claim 3, wherein said lands are disposed in a region outside of a position where said at least one connecting member is connected to said double-sided printed circuit board.

9. An interchangeable lens comprising:
a mount member provided on a rear end of a lens barrel as viewed in the direction of optical axis of optical elements disposed axially along said lens barrel, said mount member being capable of demountably mounting said lens barrel to a camera body;
a double-sided printed circuit board disposed on the front side of said mount member as viewed in the direction of said optical axis, said double-sided printed circuit board providing a planar region substantially orthogonal to said optical axis;
electrical contact members disposed proximate to a position where said mount member is located;
electrical elements disposed on the front side of said double-sided printed circuit board as viewed in the direction of said optical axis;
a first flexible connecting member for electrically connecting said double-sided printed board into electric circuits and with said electrical contact members;
a second flexible connecting member for electrically connecting said double-sided printed circuit board to said electrical elements; and
integrated circuit chip elements including ICs mounted on said double-sided printed circuit board;
wherein said chip elements are mounted on the front side of said planar region of said double-sided printed circuit board as viewed in the direction of said optical axis, while said first and second connecting members are provided on the rear side of said planar region of said double-sided printed circuit board as viewed in the direction of said optical axis.

10. An interchangeable lens according to claim 9, wherein the position where said first flexible connecting member is connected to said double-sided printed circuit board and the position where said second flexible connecting member is connected to said double-sided printed circuit board are offset in the circumferential direction around said optical axis.

11. An interchangeable lens according to claim 10, wherein said double-sided printed circuit board has a substantially doughnut-like form with a central opening about said optical axis serving as an area which permits a light beam to pass therethrough.

12. An interchangeable lens according to claim 10, wherein said double-sided printed circuit board has a central open region aperture about said optical axis which permits a light beam to pass therethrough.

13. An interchangeable lens according to claim 11, wherein said double-sided printed circuit board is provided with at least one first and a second notch formed in an outer periphery thereof, said first notch being provided at a position corresponding to a position where said first flexible connecting member is connected to said double-sided printed circuit board, and said second notch being provided at a position corresponding to a position where said second flexible connecting member is connected to said double-sided printed circuit board.

14. An interchangeable lens according to claim 10, wherein at least one of said first and second flexible connecting members comprises a flexible printed circuit board.

15. An interchangeable lens according to claim 10, wherein at least one first flexible connecting member and at least one second flexible connecting members are connected to said double-sided printed circuit board in a slacked state, so that said electrical contact members and said electric circuit elements permit relative motion therebetween in the direction of said optical axis after the connection of at least one of said flexible connecting members to said double-sided printed circuit board.

16. An interchangeable lens according to claim 11, wherein said double-sided printed circuit board comprises a rigid material.

17. An interchangeable lens according to claim 9, further comprising at least one check land for allowing electrical check of an electrical circuit in said lens barrel, said check land being provided on the rear side of said planar region of said double-sided printed circuit board as viewed in the direction of said optical axis.

18. An interchangeable lens according to claim 17, wherein said at least one check land is disposed in a region which is outside of a region where either said first or second flexible connecting member is provided.

19. An interchangeable lens according to claim 10, wherein said electric element comprises a focus motor.

20. An interchangeable lens according to claim 10, wherein said electric element comprises an aperture driving motor.

21. An interchangeable lens according to claim 12, said optical elements comprising a group of lenses disposed in alignment with said aperture in said double-sided printed circuit board.

22. An interchangeable lens according to claim 17, wherein said check land is disposed in a region that is outside of the outer periphery of said mount member.

23. An interchangeable lens according to claim 1, wherein said electric element comprises a focus motor.

24. An interchangeable lens according to claim 1, wherein said electric element comprises an aperture driving motor.

* * * * *

UNITED STATES PATENT AND TRADEMARK OFFICE
CERTIFICATE OF CORRECTION

PATENT NO. : 4,999,656

DATED : March 12, 1991

INVENTOR(S) : MASAMI SHIMIZU, ET AL.

It is certified that error appears in the above-identified patent and that said Letters Patent is hereby corrected as shown below:

Column 1

Line 37, "S" should be deleted.

Line 43, "FIRST" should be --first--.

Column 2

Line 13, "12b" should read --102b--.

Line 20, "flexible" should read --second flexible--.

Line 24, "major" should read --main--.

Column 3

Line 55, "the" (second occurrence) should be deleted.

Line 64, "value e" should read --value $\ell$--.

Line 66, "d=D-e." should read --d=D-$\ell$--

Column 4

Line 6, "has been" should be deleted.

Line 31, "provide" should read --provided--.

Line 44, "retaining 18" should read --retaining ring 18.--

Line 58, "gear" should read --gear ring--.

UNITED STATES PATENT AND TRADEMARK OFFICE
CERTIFICATE OF CORRECTION

PATENT NO. : 4,999,656
DATED : March 12, 1991
INVENTOR(S) : MASAMI SHIMIZU, ET AL Page 2 of 3

It is certified that error appears in the above-identified patent and that said Letters Patent is hereby corrected as shown below:

Column 6

Line 40, "a" should be deleted.

Line 60, "491" should read --49ℓ--.

Column 7

Line 2, "movable 2" should read --movable ring 2--.

Line 21, "in" should read --is in--.

Line 35, "denotes" should read --denote--.

Line 42, "solder" should read --soldering locations--.

Line 51, "491" should read --49ℓ--.

Column 9

Line 9, "members" should read --member--.

Line 14, "boards" should read --board--.

UNITED STATES PATENT AND TRADEMARK OFFICE
CERTIFICATE OF CORRECTION

PATENT NO. : 4,999,656

DATED : March 12, 1991

INVENTOR(S) : MASAMI SHIMIZU, ET AL.

Page 3 of 3

It is certified that error appears in the above-identified patent and that said Letters Patent is hereby corrected as shown below:

Column 10

Line 31, "members" should read --member--.

Line 52, "said" should read --an--.

Line 54, "said" should read --an--.

Line 64, "said" should read --an--.

Signed and Sealed this

Eighth Day of December, 1992

Attest:

DOUGLAS B. COMER

*Attesting Officer*   *Acting Commissioner of Patents and Trademarks*